ATTACHING WIRE LEADS TO THIN FILMS PLATED
WITH SEMICONDUCTOR COMPOUNDS

Filed May 24, 1963

JOSEPH C. JEROME
*INVENTOR.*

BY J. M. St. Amand
ATTORNEY.

United States Patent Office 3,156,891
Patented Nov. 10, 1964

3,156,891
ATTACHING WIRE LEADS TO THIN FILMS PLATED WITH SEMICONDUCTOR COMPOUNDS

Joseph C. Jerome, 3966 Madrona Road, Riverside, Calif.

Filed May 24, 1963, Ser. No. 283,119
7 Claims. (Cl. 338—323)
(Granted under Title 35, U.S. Code (1952), sec. 266)

The invention herein described may be manufactured and used by or for the Government of the United States of America for governmental purposes without the payment of any royalties thereon or therefor.

The present invention relates to the fastening of electrical conductors to thin films, such as aluminum oxide films plated with an intermetallic semiconductor compound.

In the study of optical phenomena, such devices as thin films, consist of various intermetallic semiconductor compounds, deposited under vacuum upon glass substrates as a single compound, or, stoichiometrically combined with one or more other semiconductor compounds. These plated films are then used to determine the optical properties of the semiconductors at various wavelengths. In making transmission and absorption measurements in the long wavelength region (infrared), the optimum condition would be that both the substrate and the semiconductor continue to transmit throughout the experiment. In as much as glass has a rather short transmission cut-off point (opaque beyond 4 microns), the technique of using a thin aluminum oxide (corundum) film, about 1500 to 200 angstroms thick, as the substrate, becomes a highly important tool to the optics researcher. Because of the extremely delicate nature of these films, any sharp surface or unevenness can cause the film to rupture. Prior to the present invention there was no feasible method known for mechanically fastening wire leads to such films.

The present invention provides a unique method of attaching wire leads to such fragile films thereby permitting greater use thereof and an increase in the scope of experimental investigations on semiconductors. With the present device, it will be possible to make electro-optical experiments and osberve, via instrument read-outs, whether optical changes occur when semiconductors are subjected to various degrees of magnetic fields or by induced electrical currents. Then too, by plating a single corundum film on both sides with the same (or different) semiconductor and cementing this film to two Pyrex glass rings, each containing two electrical contacts, and so positioned that they are 90 degrees apart, this device can then be used for "tunnel diode" experimental work, unique considering the thickness of the substrate. Such experiments could not be conducted without the electrical leads being attached to the plated aluminum oxide films.

It is an object of the invention, therefore, to provide a unique means for attaching electrical lead wires to plated aluminum oxide thin films.

It is another object of the invention to provide means for mounting thin semiconductor plated films and attaching electrical lead wires thereto.

A further object of the invention is to provide a means for readily fastening electrical lead wires to very fragile semiconductor plated thin films permitting more rapid production, and greater and longer use thereof.

Other objects and many of the attendant advantages of this invention will become readily appreciated as the same becomes better understood by reference to the following detailed description when considered in connection with the accompanying drawings wherein.

Referring now to the drawings like numerals refer to like parts in each of the figures.

Figures 1, 2:
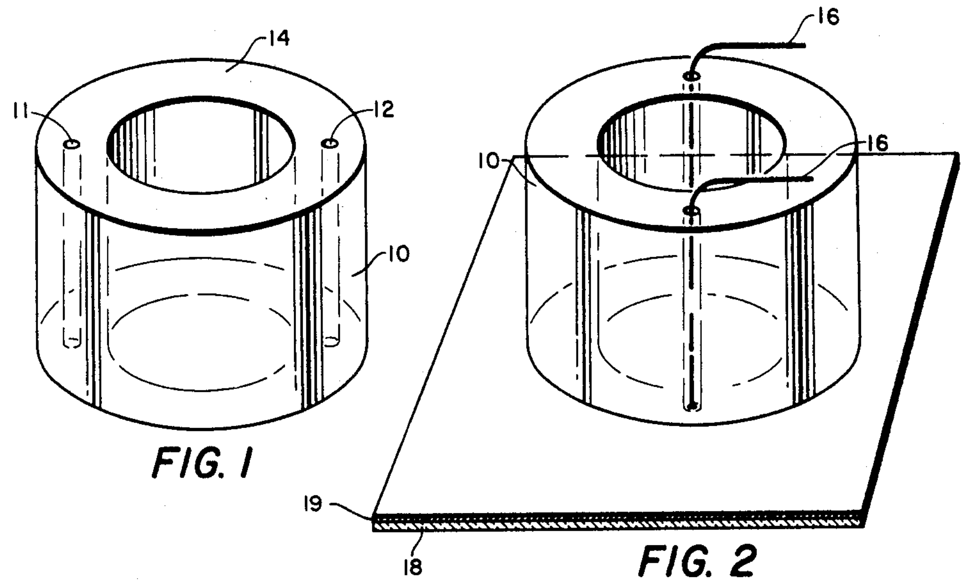
FIG. 1 is an illustrative view of a film mount showing a pair of passageways for electrical leads.
FIG. 2 shows a glass mount as in FIG. 1 cemented in place over a thin film prior to trimming away excess film, and with lead wires attached.

After making an aluminum oxide film and plating it with a semiconductor material, it is ready to be permanently mounted onto a rigid mounting for convenience and ease in handling. In the present invention a Pyrex glass ring 10, for example, as shown in FIG. 1, is prepared by drilling passageways 11 and 12 through the glass walls parallel to the radial axis. One side 14 of glass ring 10 is then polished to accept the plated film. Wires 16, lightly coated with a silver electrical conducting paint for example, as an adhesive, are pushed through passageways 11 and 12 until the tip of each wire is just flush with the polished surface of glass ring 10. A small amount of silver conductive paint 17 is then applied at the point where the tip of each wire is flush with the polished surface of mount 10 to provide a good electrical contact. When ready to secure a substrate film 18 having a semiconductor coating 19 to mount 10, sodium silicate for example is used as an adhesive on the polished surface 14 and a small amount of silver conducting paint is again placed over each wire tip. Then, while the adhesives are still moist, ring mount 10 is placed on a mounting tool and brought into contact with the surface of coating 19 on substrate film 18 as shown in FIG. 2. After drying, the excess film is cut away from around the mount and the resultant is an aluminum oxide film 18 coated with a semiconductor 19 mounted on a rigid glass mount containing two electrical leads. The unit can now be electrically tested for continuity between wires 16 and the semi-conductor coated film 18, and also the restivity of the semiconductor coated aluminum oxide film.

Figure 3:
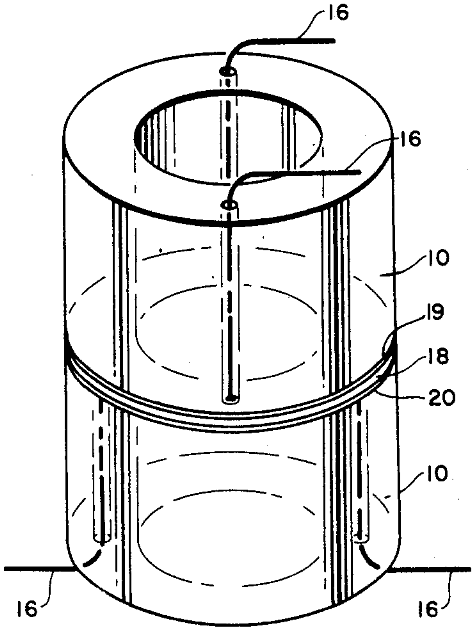
FIG. 3 shows a double assembly embodiment wherein the film is plated on both sides and a pair of wires are attached to each side of the plated film.
Figure 4:
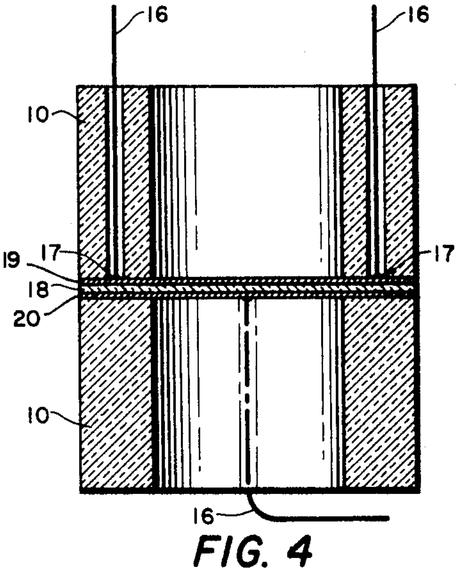
FIG. 4 is a cross-sectional view of the double assembly illustrated in FIG. 3.

This unique method of attaching wire leads to fragile thin films such as aluminum oxide semiconductor plated films greatly enables these films to be conveniently and easily handled and used. These units can be made either as a single unit, or, by evaporating semiconductor coatings 19 and 20 on respective sides of the same thin film 18, two glass rings can be cemented to the films, as shown in FIGS. 3 and 4. Then too, for a greater physical advantage, the two ring assembly offers greater protection from damage since the film sits in the center of two rigid mounting rings.

Obviously many modifications and variations of the present invention are possible in the light of the above teachings. It is therefore to be understood that within the scope of the appended claims the invention may be practiced otherwise than as specifically described.

What is claimed is:

1. A means for attaching wire leads to fragile thin films plated with semiconductor compounds comprising:
   - (*a*) a ring shaped mount having one planar circular surface polished smooth,
   - (*b*) a plurality of passageways passing through the walls of said mount and exiting through said flat polished surface,
   - (*c*) an electrical wire lead in each of said passageways and terminating at the exit thereof,
   - (*d*) the tips of said lead wires being daubed with an electrical conducting adhesive,
   - (*e*) a thin film substrate having a surface thereof coated with a semiconductor material cemented to the polished surface of said ring mount and the conducting adhesive at the tips of said lead wires making good electrical contact with the semiconductor coating on said film, thereby providing a rigid support for said semiconductor coated film and electrical contacts thereto.

2. A device as in claim 1 wherein said mount is made of Pyrex glass.

3. A device as in claim 1 wherein said electrical wire leads have a coating of electrical conducting cement to secure them in said passageways.

4. A means for attaching wire leads to fragile aluminum oxide thin films plated with semiconductor materials comprising:

(*a*) a glass ring shaped mount having a smooth polished planar circular surface, (*b*) a plurality of passageways passing through the walls of said mount and exiting through said flat polished surface, (*c*) an electrical wire lead in each of said passageways and terminating at the exit thereof, (*d*) the tips of said lead wires being daubed with an electrical conducting adhesive, (*e*) an aluminum oxide thin film substrate having a surface thereof coated with a semiconductor material cemented to the polished surface of said ring mount and the conducting adhesive at the tips of said lead wires making good electrical contact with the semiconductor coating on said film, thereby providing a rigid support for said semiconductor coated film and electrical contacts thereto.

5. A means for attaching wire leads to fragile thin films plated with semiconductor compounds comprising:

(*a*) a pair of ring shaped mounts each having a smooth polished planar circular surface, (*b*) a plurality of passageways passing through the walls of each said mount and exiting through said flat polished surface, (*c*) an electrical wire lead in each of said passageways and terminating at the exit thereof, (*d*) the tips of said lead wires being daubed with an electrical conducting adhesive, (*e*) a thin film substrate having each side thereof coated with a semiconductor material being sandwiched between and cemented to the polished surfaces of said ring mounts and the conducting adhesive at the tips of said lead wires making good electrical contact with the semiconductor coating on said film, thereby providing a rigid support for said semiconductor coated film and electrical contacts thereto.

6. A device as in claim 5 wherein said wire leads in each mount are 180 degrees apart and alternately 90 degrees apart between the two mounts in the completed assembly.

7. A means for attaching wire leads to fragile aluminum oxide thin films plated with semiconductor materials comprising:

(*a*) a pair of ring shaped glass mounts each having a smooth polished planar circular surface, (*b*) a plurality of passageways passing through the walls of each said mount and exiting through said flat polished surface, (*c*) an electrical wire lead in each of said passageways and terminating at the exit thereof, (*d*) the tips of said lead wires being daubed with an electrical conducting adhesive, (*e*) an aluminum oxide thin film substrate having each side thereof coated with a semiconductor material being sandwiched between and cemented to the polished surfaces of said ring mounts and the conducting adhesive at the tips of said lead wires making good electrical contact with the semiconductor coating on said film, thereby providing a rigid support for said semiconductor coated film and electrical contacts thereto.

References Cited in the file of this patent

UNITED STATES PATENTS

| | | |
|---|---|---|
| 599,352 | O'Neill | Feb. 22, 1898 |
| 2,547,506 | Stoffel | Apr. 3, 1951 |
| 2,674,677 | Anderson et al. | Apr. 6, 1954 |
| 2,773,158 | Myers | Dec. 4, 1956 |
| 2,777,039 | Thias | Jan. 8, 1957 |
| 3,041,436 | Brady | June 26, 1962 |
| 3,111,570 | Strang et al. | Nov. 19, 1963 |